(12) United States Patent
Korherr

(10) Patent No.: US 9,530,585 B2
(45) Date of Patent: Dec. 27, 2016

(54) SWITCHING DEVICE

(75) Inventor: Joachim Korherr, Orsingen (DE)

(73) Assignee: TRW Automotive Electronics & Components GmbH (DE)

(*) Notice: Subject to any disclaimer, the term of this patent is extended or adjusted under 35 U.S.C. 154(b) by 0 days.

(21) Appl. No.: 13/876,854

(22) PCT Filed: Aug. 8, 2011

(86) PCT No.: PCT/EP2011/003970
§ 371 (c)(1),
(2), (4) Date: May 16, 2013

(87) PCT Pub. No.: WO2012/041417
PCT Pub. Date: Apr. 5, 2012

(65) Prior Publication Data
US 2013/0284577 A1   Oct. 31, 2013

(30) Foreign Application Priority Data

Oct. 1, 2010   (DE) .................. 10 2010 047 261

(51) Int. Cl.
H01H 67/02      (2006.01)
H01H 9/16       (2006.01)
B60K 37/06      (2006.01)
H03K 17/97      (2006.01)

(52) U.S. Cl.
CPC .............. *H01H 9/16* (2013.01); *B60K 37/06* (2013.01); *H03K 17/97* (2013.01); *B60K 2350/1036* (2013.01); *H03K 2217/96062* (2013.01)

(58) Field of Classification Search
CPC ......... H01H 51/22; H01H 33/38; G06F 3/041; H01F 7/1615; H01F 7/122; H01F 7/1646
USPC .................................................. 335/131–132
See application file for complete search history.

(56) References Cited

U.S. PATENT DOCUMENTS

| 2,205,669 | A | * | 6/1940 | Pye ........................ H04R 11/00 |
| | | | | 29/606 |
| 3,055,999 | A | * | 9/1962 | Lucas ........................... 200/404 |
| 3,065,366 | A | * | 11/1962 | Speiser et al. .................. 310/15 |
| 3,072,769 | A | * | 1/1963 | Roeser ........................... 200/448 |
| 3,529,269 | A | * | 9/1970 | Gardiner ........................ 335/207 |
| 3,736,397 | A | * | 5/1973 | Pedersen .................... 200/318.1 |

(Continued)

FOREIGN PATENT DOCUMENTS

| CN | 1126362 | 1/1996 |
| CN | 2562500 | 7/2003 |

(Continued)

*Primary Examiner* — Ramon M Barrera
*Assistant Examiner* — Lisa Homza
(74) *Attorney, Agent, or Firm* — Tarolli, Sundheim, Covell & Tummino LLP

(57) ABSTRACT

The invention relates to a switching device (10), in particular in a motor vehicle, having an adjustable touch-sensitive switching element (12) which is switchable by a touch pressure exerted in a direction (s) of actuation. The switching element (12) is adapted to assume a first initial position, in which the switching element (12) bears on an abutment (14) in the direction (s) of actuation. The switching element (12) is adapted to assume a second initial position, in which, compared with the first initial position, the switching element (12) is adjusted by a predeterminable travel ($x_1$) contrary to the direction (s) of actuation.

14 Claims, 2 Drawing Sheets

(56) References Cited

U.S. PATENT DOCUMENTS

| | | | | |
|---|---|---|---|---|
| 3,815,066 A * | 6/1974 | Vinal | | 335/306 |
| 3,863,182 A * | 1/1975 | Lapointe | | 335/207 |
| 4,054,944 A * | 10/1977 | Lau | | 335/207 |
| 4,201,489 A * | 5/1980 | Zapp | | 400/485 |
| 4,409,576 A * | 10/1983 | Petersen | | 335/170 |
| 4,788,968 A * | 12/1988 | Rudashevsky et al. | | 601/78 |
| 4,908,592 A * | 3/1990 | Oudet | H02K 33/16 | 335/229 |
| 4,977,298 A * | 12/1990 | Fujiyama | | 200/5 A |
| 5,651,450 A | 7/1997 | Priesemuth | | |
| 5,815,058 A * | 9/1998 | Gizaw | | 335/132 |
| 5,896,076 A * | 4/1999 | van Namen | H01F 7/1615 | 335/222 |
| 6,002,184 A * | 12/1999 | Delson et al. | | 310/14 |
| 6,066,998 A * | 5/2000 | Trumper | H01F 7/066 | 310/13 |
| 6,069,545 A * | 5/2000 | Van Zeeland | | 335/207 |
| 6,147,422 A * | 11/2000 | Delson et al. | | 310/14 |
| 6,380,733 B1 * | 4/2002 | Apel et al. | | 324/207.2 |
| 6,429,846 B2 * | 8/2002 | Rosenberg | A63F 13/06 | 345/156 |
| 6,512,435 B2 * | 1/2003 | van Namen | E05B 47/00 | 335/229 |
| 6,639,496 B1 * | 10/2003 | van Namen | E05B 47/00 | 335/229 |
| 6,657,525 B1 * | 12/2003 | Dickens | H01G 5/16 | 200/181 |
| 7,489,296 B2 * | 2/2009 | Nishino et al. | | 345/157 |
| 7,595,712 B2 * | 9/2009 | Nishino et al. | | 335/207 |
| 7,619,329 B2 * | 11/2009 | Sakamoto | H02K 1/04 | 310/85 |
| 7,675,202 B1 * | 3/2010 | Huang | H02K 41/0356 | 310/13 |
| 7,683,508 B2 * | 3/2010 | Delson | | 310/21 |
| 7,791,439 B2 * | 9/2010 | Yatsu et al. | | 335/207 |
| 7,825,755 B2 * | 11/2010 | Toshiyoshi | G02B 26/0841 | 200/181 |
| 7,919,945 B2 * | 4/2011 | Houston et al. | | 318/460 |
| 7,994,741 B2 * | 8/2011 | Delson | | 318/114 |
| 8,355,524 B2 * | 1/2013 | Saitou | H01F 7/0289 | 335/229 |
| 8,384,316 B2 * | 2/2013 | Houston et al. | | 318/114 |
| 8,493,520 B2 * | 7/2013 | Gay | G02B 27/2214 | 345/173 |
| 8,777,880 B2 * | 7/2014 | Davis et al. | | 601/48 |
| 8,866,757 B2 * | 10/2014 | Bita | | 345/173 |
| 8,963,659 B1 * | 2/2015 | Goldsmith | H01H 59/0009 | 200/181 |
| 9,024,910 B2 * | 5/2015 | Stephanou | G06F 3/0414 | 345/173 |
| 2005/0068134 A1 * | 3/2005 | Nishino et al. | | 335/207 |
| 2005/0068135 A1 * | 3/2005 | Nishino et al. | | 335/207 |
| 2005/0104699 A1 * | 5/2005 | Bataille | H01H 57/00 | 335/222 |
| 2005/0116798 A1 * | 6/2005 | Bintoro | F15C 5/00 | 335/78 |
| 2005/0239390 A1 | 10/2005 | Leopold | | |
| 2006/0157632 A1 * | 7/2006 | Delson | | 248/550 |
| 2007/0222762 A1 * | 9/2007 | Van Delden | G06F 3/0412 | 345/173 |
| 2008/0042789 A1 * | 2/2008 | Menard | H01F 7/066 | 335/222 |
| 2008/0150911 A1 * | 6/2008 | Harrison | G06F 1/1626 | 345/173 |
| 2009/0315831 A1 * | 12/2009 | Gray | G06F 3/0202 | 345/169 |
| 2009/0315832 A1 * | 12/2009 | Gray | G06F 3/04886 | 345/169 |
| 2011/0043077 A1 * | 2/2011 | Yeh | F03G 7/005 | 310/338 |
| 2011/0157058 A1 * | 6/2011 | Bita | G02B 26/001 | 345/173 |
| 2011/0193814 A1 * | 8/2011 | Gay | G02B 27/2221 | 345/173 |
| 2011/0242009 A1 * | 10/2011 | Gray | G06F 1/1626 | 345/173 |
| 2011/0254799 A1 * | 10/2011 | Makinen | G06F 3/016 | 345/173 |
| 2011/0267298 A1 * | 11/2011 | Erhart | G06F 1/1626 | 345/173 |
| 2012/0229400 A1 * | 9/2012 | Birnbaum | G06F 3/016 | 345/173 |
| 2012/0229401 A1 * | 9/2012 | Birnbaum | G06F 3/016 | 345/173 |
| 2012/0313860 A1 * | 12/2012 | Hashimura | B82Y 15/00 | 345/173 |

FOREIGN PATENT DOCUMENTS

| | | |
|---|---|---|
| CN | 1933071 | 3/2007 |
| DE | 4230950 | 9/1993 |
| DE | 10318376 | 11/2004 |
| DE | 10 2005 013 197 | 9/2006 |
| KR | 20100045543 | 5/2010 |

* cited by examiner

SWITCHING DEVICE

RELATED APPLICATIONS

This application corresponds to PCT/EP2011/003970, filed Aug. 8, 2011, which claims the benefit of German Application No. 10 2010 047 261.1, filed Oct. 1, 2010, the subject matter, of which are incorporated herein by reference in their entirety.

BACKGROUND OF THE INVENTION

The present invention relates to a switching device, in particular in a motor vehicle.

Known from the prior art are both touch-sensitive switching devices such as, e.g., touchpads, and tactile switching devices such as, e.g., mechanical rocker or pushbutton switches. When switching tactile switching devices a contact travel has to be overcome which has a defined force/path characteristic, for instance due to the use of a switching mat or snap disk. In contrast to this, touch-sensitive switches do not necessarily provide a tactile feedback to the user, but such feedback can be generated by tappers or the like. The feedback produced in the process, however, does not feel to the user like the familiar and desirable feedback of a tactile switch key.

It is therefore the object of the invention to provide a switching device which operates in an energy-efficient and touch-sensitive manner and which (preferably selectively) is able to impart a switch feel that is comparable to that of tactile switching devices.

SUMMARY OF THE INVENTION

This object is achieved according to the invention by a switching device, in particular in a motor vehicle, including an adjustable touch-sensitive switching element which is switchable by a touch pressure exerted in a direction of actuation, the switching element being adapted to assume a first initial position, in which the switching element bears on an abutment in the direction of actuation, and the switching element being adapted to assume a second initial position, in which, compared with the first initial position, the switching element is adjusted by a predeterminable travel contrary to the direction of actuation. The touch-sensitive switching element can thus be adjusted between its first initial position, in which a movement in the direction of actuation is blocked (touch-sensitive switching without a tactile feedback), and its second initial position, in which a movement in the direction of actuation is possible (touch-sensitive switching with a tactile feedback). The predetermined travel between the two initial positions can be considered a "virtual contact travel" here since in the second initial position of the switching element, it imparts the switch feel of a traditional switching mechanism with a contact travel in spite of a switching process that continues to be touch-sensitive.

In one embodiment of the switching device, a spring is provided which urges the switching element against the abutment in the direction of actuation. The spring thus produces a pretension which provides for clearly defined and rattle-free switching positions of the switching device.

Preferably, a permanent magnet is provided which is adapted to be moved between two end positions and which can urge the switching element away from the abutment contrary to the direction of actuation. This permanent magnet thus allows a simple adjustment of the switching element between its two initial positions.

In a first end position of the movable permanent magnet, a magnetic force of the permanent magnet acting on the switching element contrary to the direction of actuation is preferably smaller than a spring force of the spring acting on the switching element in the direction of actuation. A force ratio of this kind ensures that the switching element assumes its first initial position in the first end position of the permanent magnet.

In a second end position of the movable permanent magnet, on the other hand, a magnetic force of the permanent magnet acting on the switching element contrary to the direction of actuation is preferably greater than a spring force of the spring acting on the switching element in the direction of actuation. This force ratio correspondingly ensures that the switching element is in its second initial position in the second end position of the permanent magnet.

Ideally, the initial position of the switching element is thus directly coupled to the end position of the permanent magnet.

Especially preferably, in the second end position of the permanent magnet the switching force resulting from the touch pressure and necessary for switching the switching element substantially corresponds, in terms of amount, to the difference between the magnetic force and the spring force. As a result, in the second end position of the permanent magnet a tactile feedback of the switching device commences substantially at the same time as the switching process of the switching element triggered in a touch-sensitive manner.

In a further embodiment of the switching device, an energizable magnet coil unit having a coil axis is provided, the permanent magnet being at least partly received in the magnet coil unit and being adapted to be moved in the axial direction between first and second end positions. By an appropriate energization of the magnet coil unit, the permanent magnet can therefore be adjusted between its two end positions with little effort.

Here, the coil axis preferably extends substantially parallel to the direction of actuation of the touch-sensitive switching element.

In the first end position of the permanent magnet, the magnet coil unit preferably has a different inductance than in the second end position of the permanent magnet, a device for measuring the inductance of the magnet coil unit being provided. In this way, the position of the permanent magnet can be determined at any time, and an information can thus also be obtained as to whether a switching process of the switching device is effected with or without a tactile feedback.

In a further embodiment of the switching device, a first magnetizable component, in particular a first magnet yoke of a magnet coil unit, is provided which axially fixes the permanent magnet in an axial first end position by a magnetic force when the magnet coil unit is non-energized. This is extremely advantageous in terms of energy consumption since it is thus made possible for the magnet coil unit to switch the switching device in a touch-sensitive manner without a tactile feedback, without requiring energy.

Particularly preferably, a second magnetizable component, in particular a second magnet yoke of a magnet coil unit, is (additionally) provided which axially fixes the permanent magnet in an axial second end position by a magnetic force when the magnet coil unit is non-energized. This is extremely advantageous in terms of energy consumption since it is thus made possible for the magnet coil unit to switch the switching device in a touch-sensitive manner with a tactile feedback, without requiring energy.

In a further embodiment of the switching device, the touch-sensitive switching element is coupled to an axially movable, magnetizable body that is oriented substantially coaxially with the permanent magnet.

Here, the touch-sensitive switching element may be attached to a first lever arm and the magnetizable body may be attached to a second lever arm of a two-armed lever.

As an alternative, the touch-sensitive switching element may be connected to the magnetizable body and may be adapted to be moved in the axial direction jointly with the magnetizable body. This results in a structure of the switching device that is compact and simple by design, which, in the final analysis, also has an advantageous effect on production costs.

BRIEF DESCRIPTION OF THE DRAWINGS

Further features and advantages of the invention will be apparent from the following description of preferred embodiments with reference to the drawings, in which.

DESCRIPTION OF EXEMPLARY EMBODIMENTS

Figure 1:
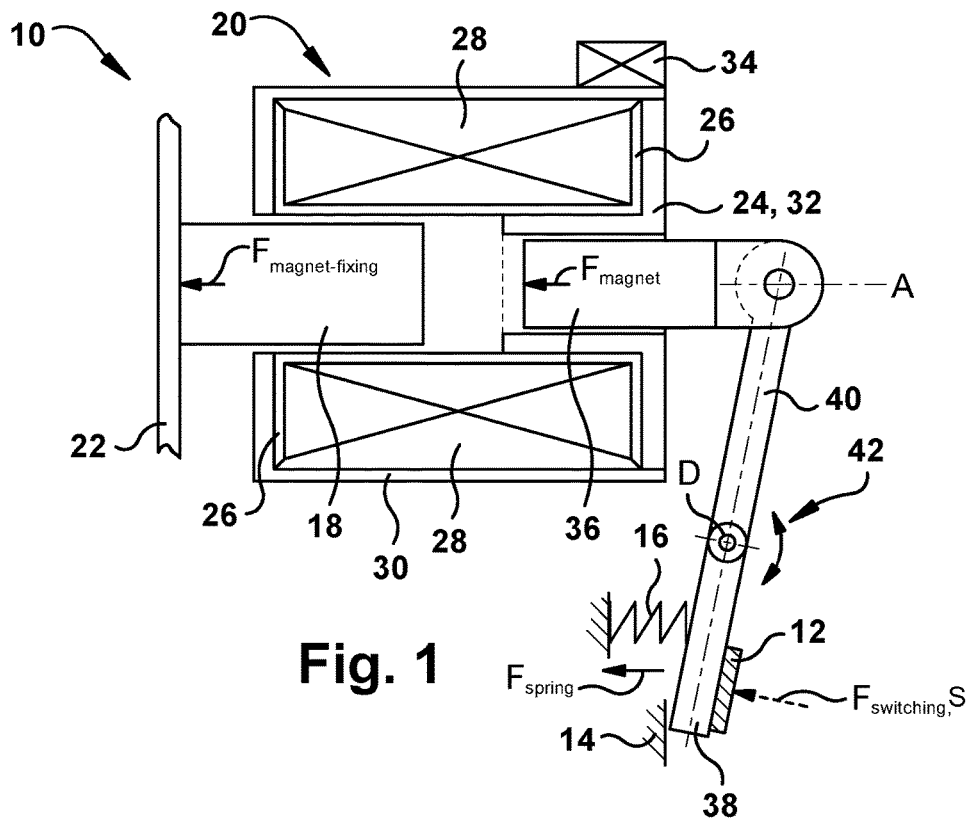
FIG. 1 shows a schematic sketch of a switching device according to a first embodiment of the invention, with a switching element in a first initial position.
Figure 2:
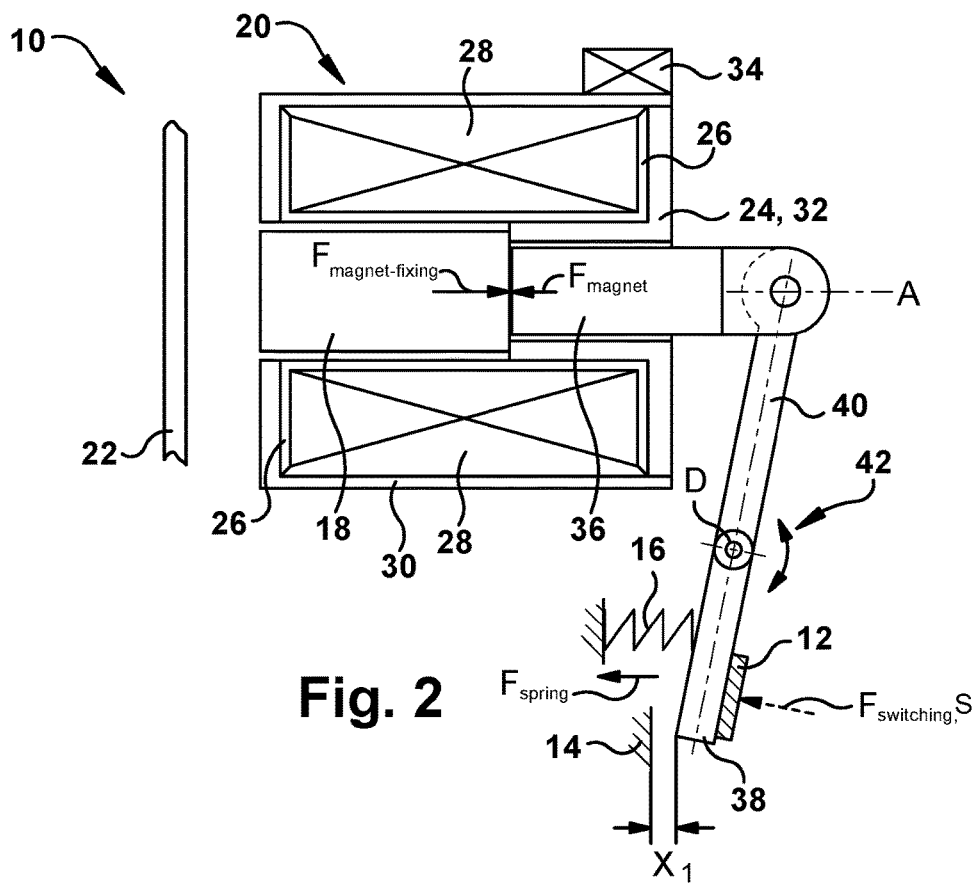
FIG. 2 shows a schematic sketch of the switching device according to the invention as shown in FIG. 1, with the switching element in a second initial position.

FIGS. 1 and 2 show a first embodiment of a switching device 10, in particular in a motor vehicle, including an adjustable, touch-sensitive switching element 12 which is switchable by a touch pressure exerted in a direction s of actuation. Here, the touch-sensitive switching element 12 is, for example, a generally known touch-sensitive capacitive field, as is also employed in conventional touchpads, for example.

In FIG. 1, the touch-sensitive switching element 12 is in a first initial position, in which the switching element 12 bears on an abutment 14 in the direction s of actuation. This means that when a touch pressure is exerted in the direction s of actuation, the switching element 12 is switched without it moving in a way so as to be perceptible to the user. In other words, the switching device 10 has no tactile feedback during switching when the switching element 12 is in its first initial position. The switching process is effected in a purely touch-sensitive manner.

FIG. 2 shows a sketch of the switching device 10 according to FIG. 1, the switching element 12 being in a second initial position, in which, compared with the first initial position, the switching element 12 is adjusted by a predeterminable travel $x_1$ contrary to the direction s of actuation. The switching element 12 can be adjusted accordingly by the travel $x_1$ in its direction s of actuation. In this case, the predeterminable travel $x_1$ can also be referred to as a "virtual contact travel" since the user is given a tactile feedback. The switching process proper, however, still proceeds in a purely touch-sensitive manner, just as in FIG. 1.

A user of the switching device 10 can therefore choose between a touch-sensitive switching process without a tactile feedback (cf. FIG. 1) and a touch-sensitive switching process with a tactile feedback (cf. FIG. 2).

According to FIGS. 1 and 2, the switching device 10 includes a spring 16 which urges the switching element 12 against the abutment 14 in the direction s of actuation, that is, into the first initial position according to FIG. 1. In the present case, the spring 16 is a tension spring which applies a spring force $F_{spring}$ to the switching element 12 to urge it against the abutment 14. Instead of the tension spring, in alternative embodiments a pressure spring may, of course, also be made use of, which urges the switching element 12 against the abutment 14 in the direction s of actuation.

The switching device 10 further comprises a permanent magnet 18 which is adapted to be moved between two end positions and which can urge the switching element 12 away from the abutment 14 contrary to the direction s of actuation, that is, into the second initial position according to FIG. 2.

In a first end position of the movable permanent magnet 18 according to FIG. 1, a magnetic force $F_{magnet}$ of the permanent magnet 18 acting on the switching element 12 contrary to the direction s of actuation is smaller than a spring force $F_{spring}$ of the spring 16 acting on the switching element 12 in the direction s of actuation.

In a second end position of the movable permanent magnet 18 according to FIG. 2, on the other hand, the magnetic force $F_{magnet}$ of the permanent magnet 18 acting on the switching element 12 contrary to the direction s of actuation is greater than a spring force $F_{spring}$ of the spring 16 acting on the switching element 12 in the direction s of actuation.

Consequently, the first and second initial positions of the switching element 12 are directly coupled to the first and second end positions of the permanent magnet 18, respectively, as a result of which the initial position of the switching element 12 can be set using the position of the permanent magnet 18.

In a particularly preferred variant of an embodiment, in the second end position (FIG. 2) of the permanent magnet 18, the switching force $F_{switching}$ resulting from the touch pressure and necessary for switching the switching element 12 substantially corresponds, in terms of amount, to the difference between the magnetic force $F_{magnet}$ and the spring force $F_{spring}$. Such a force ratio offers the advantage that the touch-sensitive switching of the switching element 12 is performed substantially at the same time as the tactile feedback to the user. In addition, this makes sure that in each touch-sensitive switching process a tactile feedback is effected, and vice versa.

In FIGS. 1 and 2, provision is further made for an energizable magnet coil unit 20 having a coil axis A, the permanent magnet 18 being at least partly received in the magnet coil unit 20 and being adapted to be moved in the axial direction between the first end position (FIG. 1) and the second end position (FIG. 2). Further provided is a first magnetizable component 22 which axially fixes the permanent magnet 18 in the first end position by a magnetic force $F_{magnet-fixing}$ when the magnet coil unit 20 is non-energized. In the first embodiment according to FIGS. 1 and 2, the first magnetizable component 22 is an iron sheet which is arranged so as to be axially non-displaceable in relation to the magnet coil unit 20. Furthermore, a second magnetizable component 24 is provided which axially fixes the permanent magnet 18 in the second end position by a magnetic force $F_{magnet-fixing}$ when the magnet coil unit 20 is non-energized.

Here, the magnetic forces $F_{magnet-fixing}$ and $F'_{magnet-fixing}$ are so great that the permanent magnet 18 can be moved out of its first or, respectively, second end position only by an energization of the magnet coil unit 20.

According to FIGS. 1 and 2, the magnet coil unit 20 includes a coil body 26, in particular made from a plastic material, and a metal wire 28, in particular an enameled copper wire, which is wound on the coil body 26. In addition, the magnet coil unit 20 includes a magnet pot 30, made in particular of iron, which encloses the wound metal wire 28 and the coil body 26, as well as a magnet yoke 32 which, in the first embodiment of the switching device 10, constitutes the second magnetizable component 24 (FIG. 2).

In the first end position of the permanent magnet 18 according to FIG. 1, the magnet coil unit 20 has a different inductance than in the second end position of the permanent magnet 18 according to FIG. 2, a device 34 for measuring the inductance of the magnet coil unit 20 being provided. By means of this device 34, it can be determined at any time with little effort whether the switching device 10 is in an operating condition without a tactile feedback of a switching process (first initial position of the switching element 12 according to FIG. 1) or in an operating condition with a tactile feedback of a switching process (second initial position of the switching element 12 according to FIG. 2).

The touch-sensitive switching element 12 is coupled to an axially movable, magnetizable body 36 that is oriented substantially coaxially with the permanent magnet 18. According to the first embodiment in FIGS. 1 and 2, the touch-sensitive switching element 12 is attached here to a first lever arm 38 and the magnetizable body 36 is attached to a second lever arm 40 of a two-armed lever 42, the lever 42 being adapted to be swiveled about a fulcrum D.

The functioning of the switching device 10 is as follows:

In the first end position of the permanent magnet 18 according to FIG. 1, the torque resulting from the magnetic force $F_{magnet}$ is smaller than the oppositely acting torque resulting from the spring force $F_{spring}$, so that the switching element 12 assumes its first initial position, in which it (permanently) bears on the abutment 14 in its direction s of actuation. In this case, the switching of the switching device 10 is not perceivable to the user in a tactile manner and is effected in a purely touch-sensitive manner by the switching force $F_{switching}$ applied by the user.

In the second end position of the permanent magnet 18 according to FIG. 2, the torque resulting from the magnetic force $F_{magnet}$ is greater than the oppositely acting torque resulting from the spring force $F_{spring}$, so that the switching element 12 assumes the second initial position. The magnet yoke 32 of the magnet coil unit 20 forms an axial stop for the permanent magnet 18 which, for its part, forms an axial stop for the magnetizable body 36, so that the second initial position of the switching element 12 is exactly defined.

For switching the switching device 10, the required switching force $F_{switching}$ is again applied by means of the touch pressure, so that the switching element 12 switches in a touch-sensitive manner. But in this case the switching force $F_{switching}$ is also sufficient to adjust the switching element 12 by the predeterminable travel $x_1$ in its direction s of actuation. This is done with the assistance of the spring force $F_{spring}$ and contrary to the magnetic force $F_{magnet}$ between the permanent magnet 18 and the magnetizable body 36.

Figure 3:
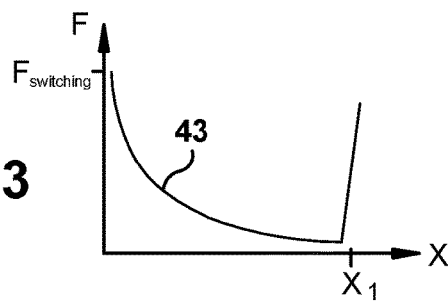
FIG. 3 shows a diagram with a force/path characteristic that develops during the switching process of the switching device as shown in FIG. 2.

In this adjustment of the switching element 12 in the direction s of actuation, a characteristic 43 arises as is illustrated in the diagram according to FIG. 3, the travel x of the switching element 12 in the direction s of actuation being plotted on the abscissa, proceeding from the second initial position according to FIG. 2, and the force F applied being plotted on the ordinate. The characteristic curve 43 shown is very similar to the curve of a switch having a switching mat or a snap disk, particularly when the lever 42 is actuated by means of a pressure spring (not drawn in).

Figure 4:
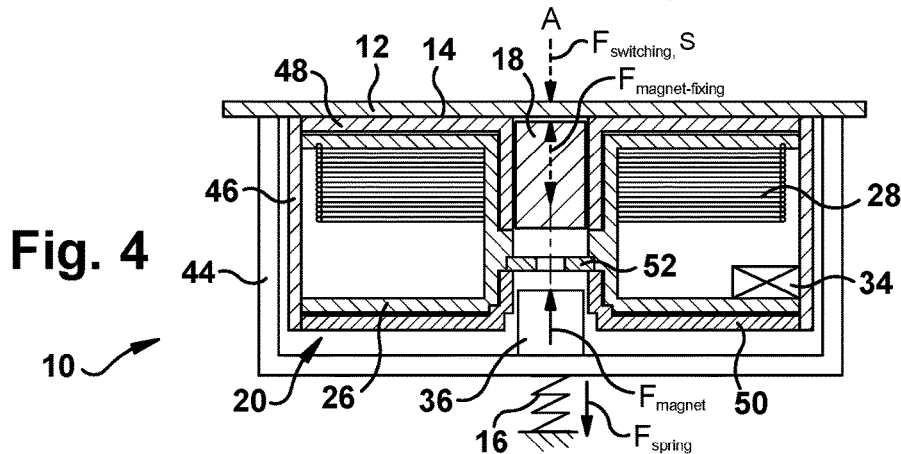
FIG. 4 shows a schematic sketch of a switching device according to a second embodiment of the invention, with a switching element in a first initial position.
Figure 5:
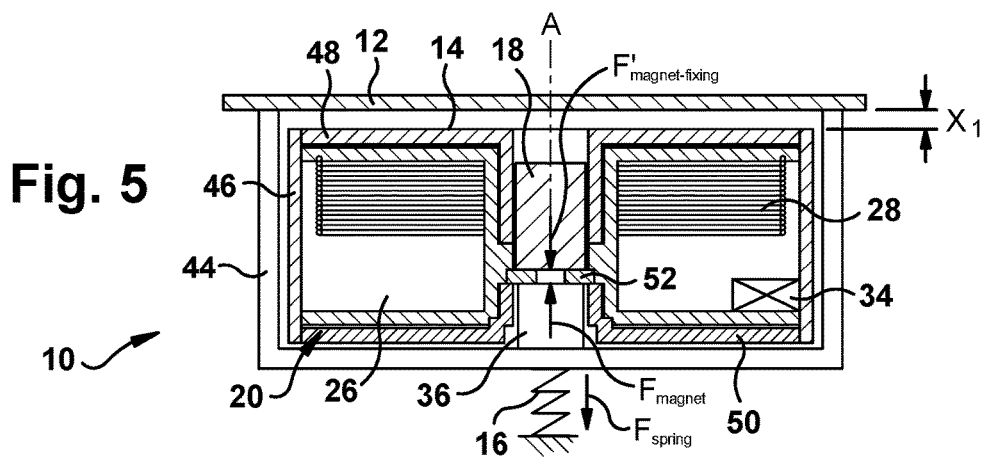
FIG. 5 shows a schematic sketch of the switching device according to the invention as shown in FIG. 4, with the switching element in a second initial position.
Figure 6:
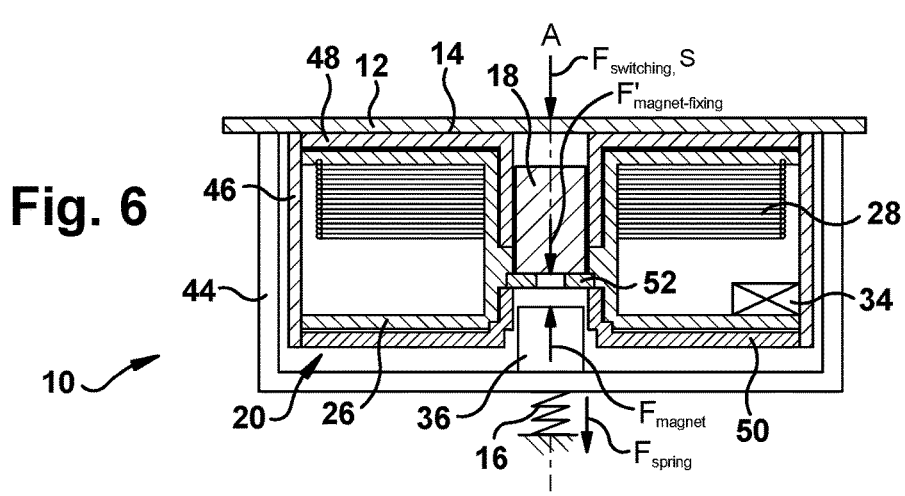
FIG. 6 shows a schematic sketch of the switching device according to the invention as shown in FIG. 5, after applying a switching force.

FIGS. 4 to 6 show a second embodiment of the switching device 10. Since the functional principle and many of the structural features do not differ from those of the first embodiment according to FIGS. 1 and 2, reference is explicitly made in this respect to the above description of FIGS. 1 and 3. To avoid any repetitions, only structural differences will be discussed below.

FIG. 4, analogously to FIG. 1, shows the switching device 10 with the switching element 12 in the first initial position, while FIG. 5, analogously to FIG. 2, shows the switching device 10 with the switching element 12 in the second initial position. Proceeding from FIG. 5, FIG. 6 finally shows the switching device 10 after application of the switching force $F_{switching}$.

The second embodiment of the switching device 10 differs from the first embodiment mainly in that the touch-sensitive switching element 12 according to FIGS. 4 to 6 is connected with the magnetizable body 36 and adapted to be moved jointly with it in the axial direction. In the present case, the switching element 12 and the magnetizable body 36 are connected with each other by housing webs 44, for example, and are adjustable relative to the magnet coil unit 20 in the axial direction by the predeterminable travel $x_1$.

As can be seen in FIGS. 4 and 6, the abutment 14 is constituted here by the magnet coil unit 20.

In the second embodiment according to FIGS. 4 to 6, the coil axis A extends substantially parallel to the direction s of actuation of the touch-sensitive switching element 12. In the first embodiment, too, variants are conceivable in which the coil axis A extends substantially parallel to the direction s of actuation of the touch-sensitive switching element 12, this being decisively dependent on the shape and arrangement of the lever 42.

Instead of the magnet pot 30 and the magnet yoke 32 according to FIGS. 1 and 2, the magnet coil unit 20 according to FIGS. 4 to 6 comprises a magnetic tube 46, preferably made of iron, and a first magnet yoke 48, preferably made of iron, as well as a second magnet yoke 50, preferably likewise made of iron. The first magnet yoke 48 here assumes the function of the first magnetizable component 22 and the second magnet yoke 50 assumes the function of the second magnetizable component 24. The magnetic force $F_{magnet-fixing}$ between the first magnet yoke 48 and the permanent magnet 18 in the first end position (cf. FIG. 4) is sufficient here to hold the permanent magnet 18 in this first end position even when the magnet coil unit 20 is non-energized, although the first magnet yoke 48 does not form an axial stop for the permanent magnet 18.

A further difference from the first embodiment is the spacer disk 52 which is provided between the permanent magnet 18 and the magnetizable body 36 or the second magnet yoke 50 and which is preferably formed from a plastic material. This spacer disk 52 allows the magnetic force $F_{magnet}$ between the permanent magnet 18 and the magnetizable body 36 and the magnetic force $F'_{magnet-fixing}$ between the permanent magnet 18 and the second magnet yoke 50 in the second end position of the permanent magnet 18 (cf. FIGS. 5 and 6) to be set to a desired value involving little effort.

In this second embodiment, too, the permanent magnet 18 can be moved between its first end position (FIG. 4) and its second end position (FIGS. 5 and 6) by means of a short-time energization of the magnet coil unit 20. In dependence on these end positions of the permanent magnet 18, the adjustable switching element 12 assumes the first initial position according to FIG. 4 or the second initial position according to FIG. 5. Depending on the initial position of the switching element 12, the switching device 10 can be switched in a touch-sensitive manner without tactile feedback (cf. FIG. 4) or with tactile feedback (FIGS. 5 and 6). The tactile feedback imparts to the user the feel of a traditional mechanical switching process by means of a virtual contact travel.

The invention claimed is:

1. A switching device comprising:
a touch-sensitive switching element (12) which is switchable by a touch pressure exerted in a direction (s) of actuation,
the switching element (12) being adapted to assume a first initial position, in which the switching element (12) bears on an abutment (14) in the direction (s) of actuation, and
the switching element (12) being adapted to assume a second initial position, in which, compared with the first initial position, the switching element (12) is moved a predeterminable travel ($x_1$) contrary to the direction (s) of actuation;
wherein the switching element is spaced apart from the abutment when the switching element is in the second initial position.

2. The switching device according to claim 1, wherein a spring (16) is provided which urges the switching element (12) against the abutment (14) in the direction (s) of actuation.

3. The switching device according to claim 2 wherein in a first end position of the movable permanent magnet (18), a magnetic force ($F_{magnet}$) of the permanent magnet (18) acting on the switching element (12) contrary to the direction (s) of actuation is smaller than a spring force ($F_{spring}$) of the spring (16) acting on the switching element (12) in the direction (s) of actuation.

4. The switching device according to claim 2, wherein in a second end position of the movable permanent magnet (18), a magnetic force ($F_{magnet}$) of the permanent magnet (18) acting on the switching element (12) contrary to the direction (s) of actuation is greater than a spring force ($F_{spring}$) of the spring (16) acting on the switching element (12) in the direction (s) of actuation.

5. The switching device according to claim 4, wherein the second end position of the permanent magnet (18), a switching force ($F_{switching}$) resulting from the touch pressure and necessary for switching the switching element (12) substantially corresponds, in terms of amount, to the difference between the magnetic force ($F_{magnet}$) and the spring force ($F_{spring}$).

6. The switching device according to claim 1 wherein a permanent magnet (18) is provided which is adapted to be moved between two end positions and which can urge the switching element (12) away from the abutment (14) contrary to the direction (s) of actuation.

7. The switching device according to claim 6, wherein an energizable magnet coil unit (20) is provided which has a coil axis (A), the permanent magnet (18) being at least partly received in the magnet coil unit (20) and being adapted to be moved in the axial direction between first and second end positions.

8. The switching device according to claim 7, wherein the coil axis (A) extends substantially parallel to the direction (s) of actuation of the touch-sensitive switching element (12).

9. The switching device according to claim 7 wherein the first end position of the permanent magnet (18), the magnet coil unit (20) has a different inductance than in the second end position of the permanent magnet, a device (34) for measuring the inductance of the magnet coil unit (20) being provided.

10. The switching device according to claim 7, wherein a first magnetizable component (22) is provided which axially fixes the permanent magnet (18) in an axial first end position by a magnetic force ($F_{magnet-fixing}$) when the magnet coil unit (20) is non-energized.

11. The switching device according to claim 7, characterized in that a second magnetizable component (24) is provided which axially fixes the permanent magnet (18) in an axial second end position by a magnetic force ($F'_{magnet-fixing}$) when the magnet coil unit (20) is non-energized.

12. The switching device according to claim 6, wherein the touch-sensitive switching element (12) is coupled to an axially movable, magnetizable body (36) that is oriented substantially coaxially with the permanent magnet (18).

13. The switching device according to claim 12, wherein the touch-sensitive switching element (12) is attached to a first lever arm (38) and the magnetizable body (36) is attached to a second lever arm (40) of a two-armed lever (42).

14. The switching device according to claim 12, wherein the touch-sensitive switching element (12) is connected to the magnetizable body (36) and adapted to be moved in the axial direction jointly with the magnetizable body (36).

* * * * *